(12) United States Patent
Downing

(10) Patent No.: US 8,056,615 B2
(45) Date of Patent: Nov. 15, 2011

(54) EVAPORATIVE COMPACT HIGH INTENSITY COOLER

(75) Inventor: Robert Scott Downing, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 1205 days.

(21) Appl. No.: 11/654,446

(22) Filed: Jan. 17, 2007

(65) Prior Publication Data

US 2008/0169087 A1    Jul. 17, 2008

(51) Int. Cl.
*H05K 7/20* (2006.01)
(52) U.S. Cl. ................. 165/80.4; 361/699; 361/700
(58) Field of Classification Search ............. 165/80.4, 165/185, 104.26–104.33; 361/688–689, 361/700, 699
See application file for complete search history.

(56) References Cited

U.S. PATENT DOCUMENTS

| | | | | |
|---|---|---|---|---|
| 3,923,383 A | * | 12/1975 | Engel et al. | 359/845 |
| 4,386,505 A | * | 6/1983 | Little | 62/51.1 |
| 4,516,632 A | * | 5/1985 | Swift et al. | 165/167 |
| 5,088,005 A | * | 2/1992 | Ciaccio | 361/699 |
| 5,193,611 A | * | 3/1993 | Hesselgreaves | 165/165 |
| 5,265,670 A | * | 11/1993 | Zingher | 165/80.4 |
| 5,423,376 A | * | 6/1995 | Julien et al. | 165/80.4 |
| 5,836,383 A | * | 11/1998 | Zwittig | 165/167 |
| 6,134,785 A | * | 10/2000 | Walter et al. | 29/890.054 |
| 6,167,948 B1 | * | 1/2001 | Thomas | 165/104.26 |
| 6,167,952 B1 | | 1/2001 | Downing | 165/167 |
| 6,210,986 B1 | * | 4/2001 | Arnold et al. | 438/42 |
| 6,301,109 B1 | * | 10/2001 | Chu et al. | 361/690 |
| 6,688,381 B2 | * | 2/2004 | Pence et al. | 165/80.4 |
| 7,017,655 B2 | * | 3/2006 | Wilson et al. | 165/80.4 |
| 7,278,466 B2 | * | 10/2007 | Fujisaki | 165/80.4 |
| 7,414,843 B2 | * | 8/2008 | Joshi et al. | 361/699 |
| 7,537,047 B2 | * | 5/2009 | Lai et al. | 165/80.4 |
| 7,626,407 B2 | * | 12/2009 | Kabbani | 324/760 |
| 7,729,118 B2 | * | 6/2010 | Lai et al. | 361/699 |
| 2003/0150599 A1 | | 8/2003 | Suzuki | |
| 2003/0159809 A1 | | 8/2003 | Valenzuela | |
| 2003/0213580 A1 | * | 11/2003 | Philpott et al. | 165/46 |
| 2004/0206477 A1 | * | 10/2004 | Kenny et al. | 165/80.4 |
| 2005/0022978 A1 | * | 2/2005 | Duval | 165/104.26 |
| 2005/0205241 A1 | * | 9/2005 | Goodson et al. | 165/80.4 |
| 2005/0230085 A1 | | 10/2005 | Valenzuela | |
| 2006/0002087 A1 | * | 1/2006 | Bezama et al. | 361/699 |
| 2006/0144565 A1 | | 7/2006 | Tsai | |
| 2007/0227704 A1 | * | 10/2007 | Nagai et al. | 165/104.33 |

* cited by examiner

*Primary Examiner* — Leonard R Leo
(74) *Attorney, Agent, or Firm* — Stephen G. Mican

(57) ABSTRACT

An evaporative compact high intensity cooler (ECHIC) for transferring heat from a heat source along a heat conduction surface of the heat source with a two-phase coolant, comprises a flow passage labyrinth of flow passages with short conduction paths interrupted by coolant columns that all radiate from at least one coolant supply passage and offer the coolant expanding volume as the coolant evaporates due to absorbing heat within the flow passages from the heat conduction surface to maintain nearly isobaric conditions for the coolant to maintain relatively constant temperature throughout the ECHIC as it absorbs heat from the heat source and limit boundary layer formation within the flow passages to improve heat transfer.

20 Claims, 10 Drawing Sheets

US 8,056,615 B2

EVAPORATIVE COMPACT HIGH INTENSITY COOLER

FIELD OF THE INVENTION

The invention relates to heat sinks and coolers, and more particularly to heat sinks and coolers for limited space applications that require a high degree of heat transfer.

BACKGROUND OF THE INVENTION

Very high heat dissipations occur in high power electronic devices such as high-energy laser and the high power microwave devices. Surface heat fluxes for laser diodes are approximately 100 to 500 w/cm$^2$. Microwave interaction and collector cavity heat fluxes can reach 1000 to 2000 w/cm$^2$ respectively. High power electronics such as converters, inverters and motor drives typically have devices that generate heat fluxes of 10 to 40 w/cm$^2$ at the device level and even higher at the die level. High power CPU packages for high performance computers will dissipate as much as 100 w/cm$^2$ over a footprint of a few square centimeters. All of these devices must operate within acceptable temperature ranges regardless of their heat dissipation. Such devices also demand good surface isothermality for optimum device performance. Where the ultimate heat sink is at a temperature level that is too high for direct or cascaded loop cooling, rejection of device waste heat to the heat sink requires thermal pumping to a higher temperature level. An efficient refrigeration system is a vapour cycle wherein an evaporator absorbs heat at a lower temperature and a loop condenser rejects it at a higher temperature. Vapour cycle systems offer two advantages in thermal control at the evaporator. First, pressure level may control temperature due to the pressure-temperature relationship of the saturated vapour. Second, vapour cycle systems exhibit better heat source isothermality than single-phase systems because the coolant changes temperature with heat addition in such systems, such as with the compact high intensity cooler (CHIC) described in U.S. Pat. No. 6,167,952 to Downing. Given these and other advantages of two-phase heat absorption, a high performance evaporator must be capable of accepting high heat fluxes and providing nearly constant temperature heat rejection over the device footprint. Additionally, the thermal resistance of the device should be small, thereby reducing the required lift of the refrigeration system. The evaporator should be capable of evaporating the coolant to high outlet qualities without high pressure drops that would penalise the cycle. Vapour specific volumes are in the range of 140 to 1000 times larger than their liquids. To manage flow velocities and thereby pressure losses during the large changes in volumetric flow a flow structure with and expanding flow area is required. Flow velocities should remain large enough to maintain shear control, however. These conditions serve to maintain annular flow and wet wall conditions capable of withstanding high heat fluxes to high outlet qualities.

Some high energy systems that have short duty cycles make expendable coolants an attractive solution to energy management. In this case, stored liquid coolant may evaporate in the evaporator and then vent in an open cycle arrangement. The desired features of an evaporator for this open cycle system are identical to the closed cycle heat absorber.

SUMMARY OF THE INVENTION

The invention generally comprises an evaporative compact high intensity cooler (ECHIC) for transferring heat from a heat source along a heat conduction surface of the heat source with a two-phase coolant, comprising: a flow passage labyrinth of flow passages with short conduction paths interrupted by coolant columns that all radiate from at least one coolant supply passage and offer the coolant expanding volume as the coolant evaporates due to absorbing heat within the flow passages from the heat conduction surface to maintain nearly isobaric conditions for the coolant to maintain relatively constant temperature throughout the ECHIC as it absorbs heat from the heat source and limit boundary layer formation within the flow passages to improve heat transfer.

DETAILED DESCRIPTION OF THE INVENTION

Figure 2:
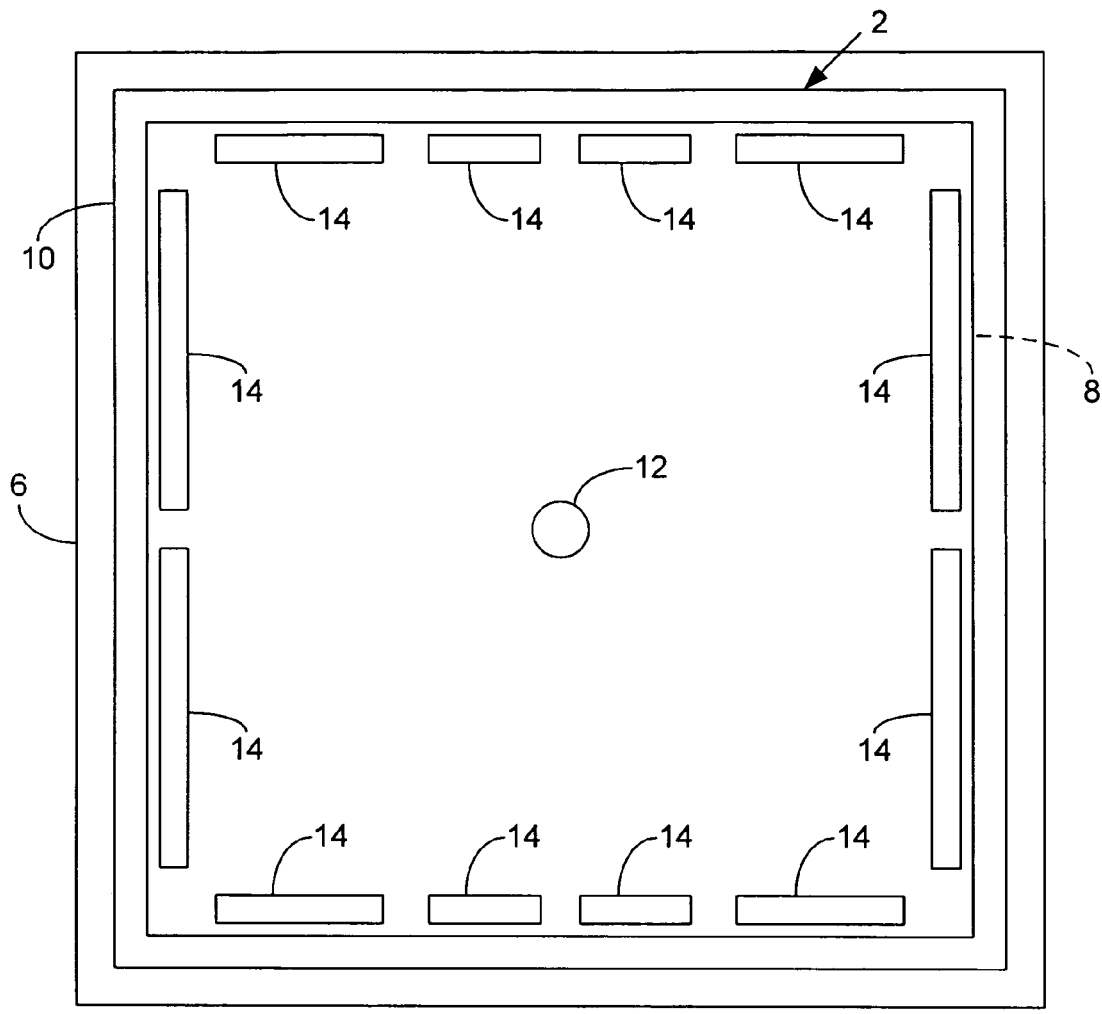
FIG. 2 is a top view of the ECHIC according to the possible embodiment of the invention shown in FIG. 1.
Figure 1:
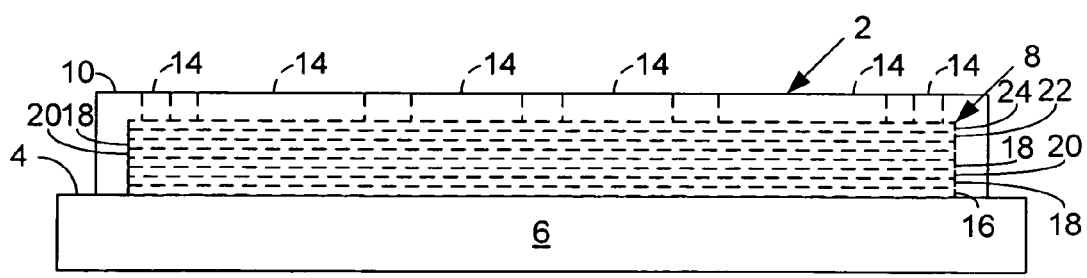
FIG. 1 is a side view of an Evaporative Compact High Intensity Cooler (ECHIC) according to a possible embodiment of the invention that transfers heat from a heat source along a heat source conduction surface.

FIGS. 1 and 2 are side and top views, respectively, of an evaporative compact high intensity cooler (ECHIC) 2 according to a possible embodiment of the invention that attaches to a heat source 4 along a heat source conduction surface 6. The heat source 4 may comprise any high power device with a level of generated heat flux along the surface 6 that requires heat transfer for suitable operation. The ECHIC 2 comprises a three-dimensional flow passage labyrinth 8 that directs a flow of coolant to and from the surface 6 of the heat source 4. A housing 10 for the ECHIC 2 may have at least one coolant supply port 12 and at least one coolant exhaust port 14 that each couple to the labyrinth 8 for this purpose.

Figure 3:
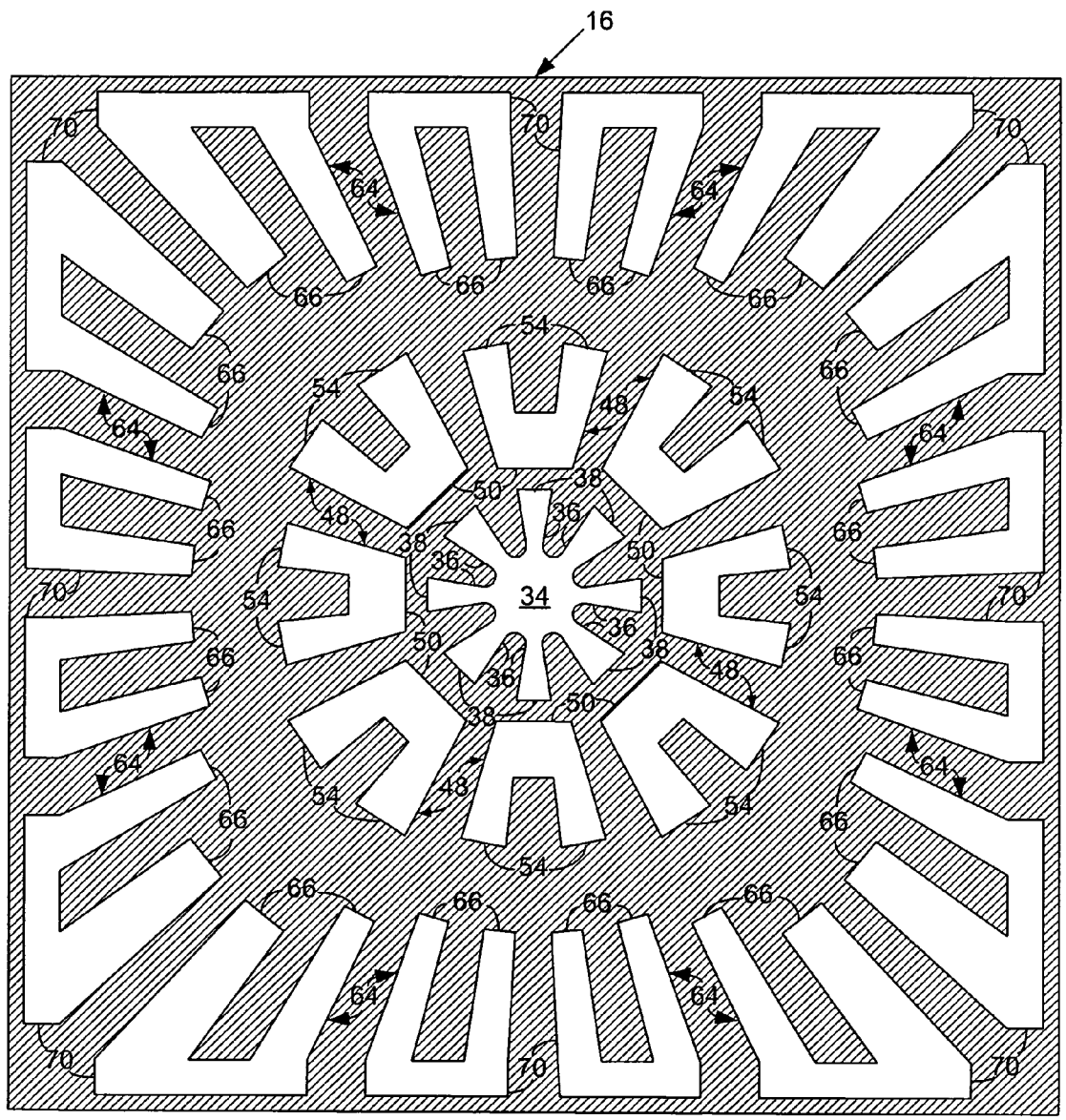
FIG. 3 is a top view of a target layer flow passage lamination within the ECHIC that covers a substantial portion of the conduction surface of the heat source shown in FIGS. 1 and 2.
Figure 4:
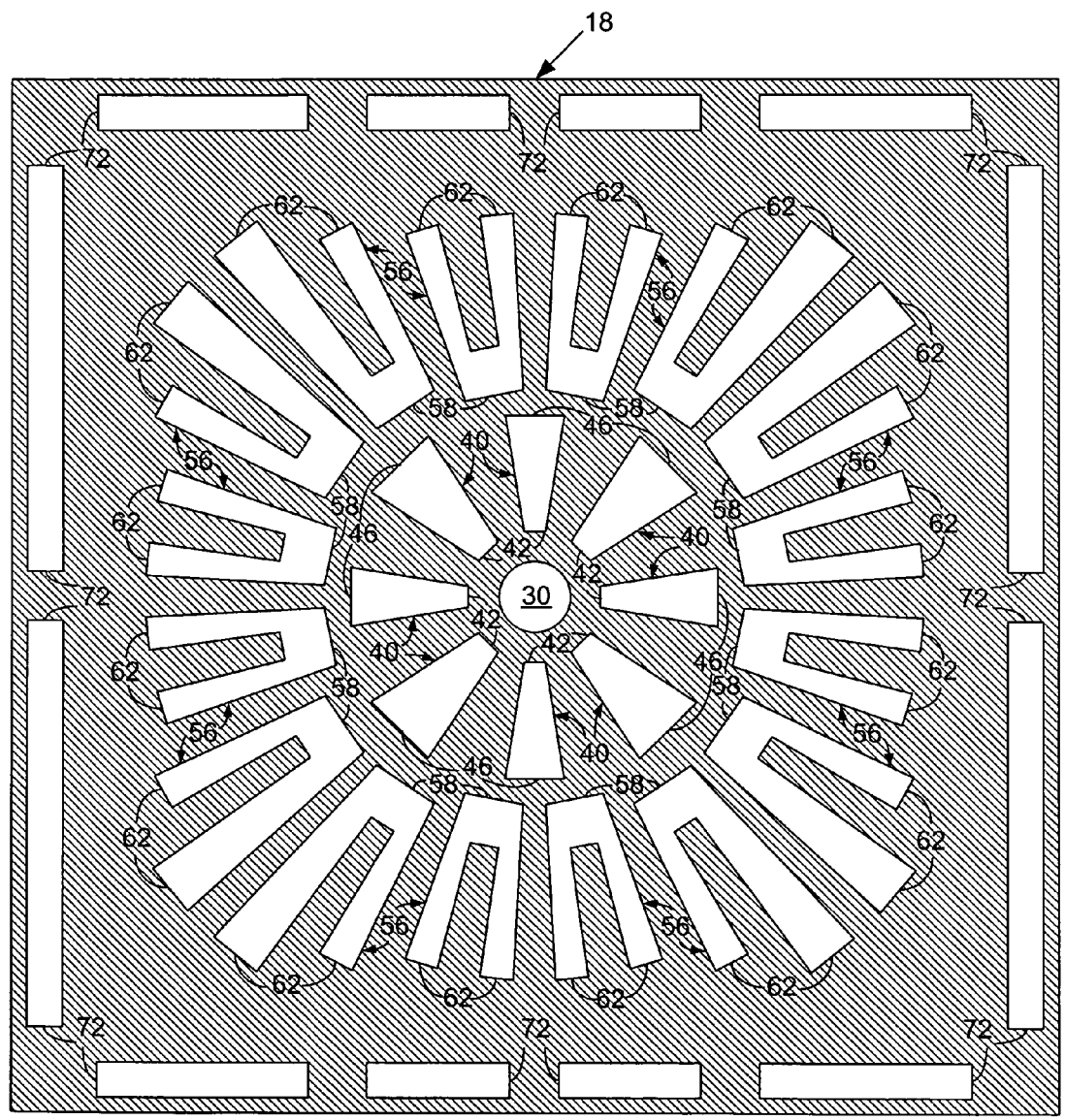
FIG. 4 is an "even layer" flow passage lamination that covers the target layer flow passage lamination.
Figure 5:
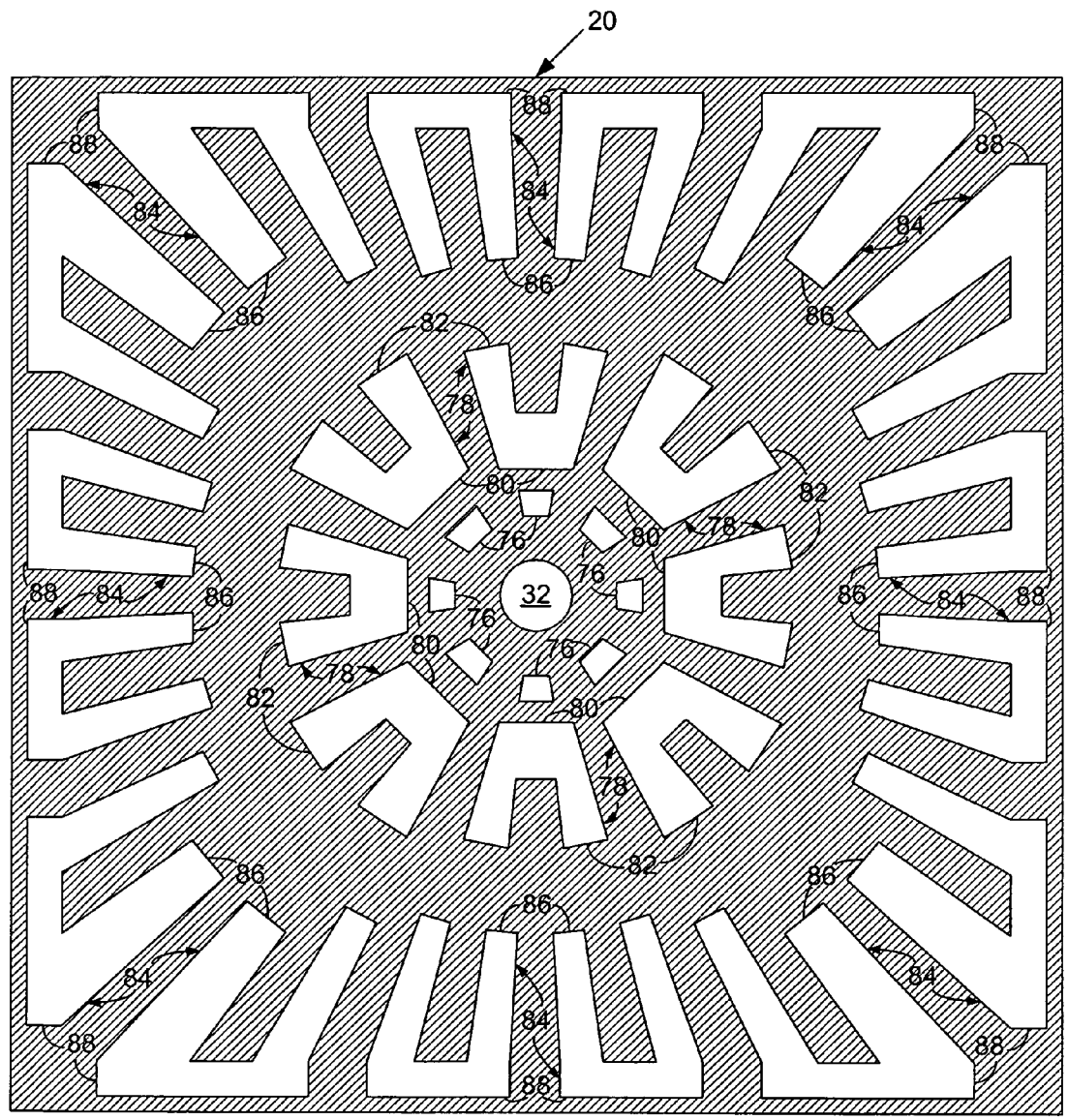
FIG. 5 is a top view of an "odd layer" flow passage lamination that covers at least one even layer flow passage lamination.
Figure 6:
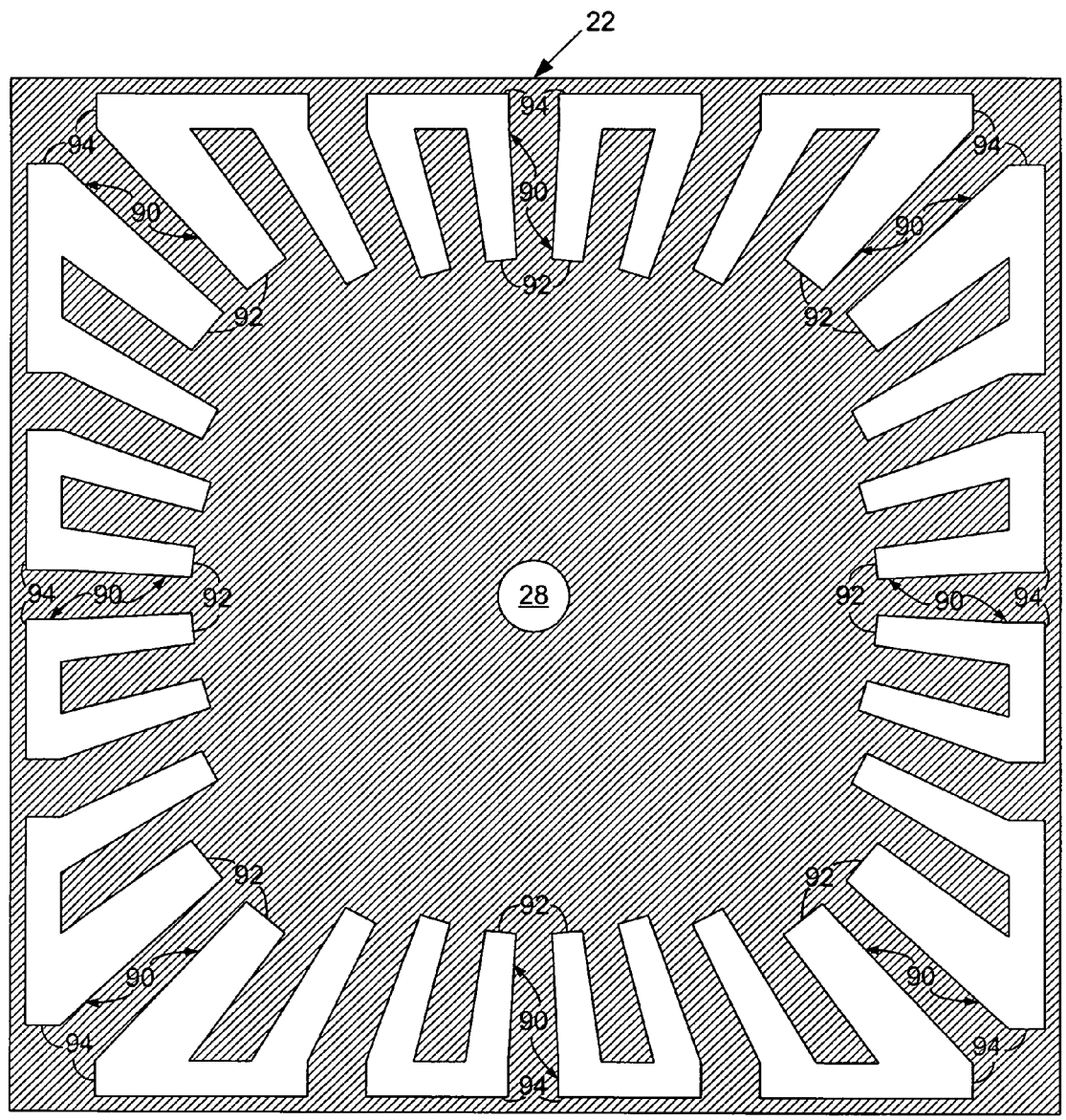
FIG. 6 is a top view of an "interface layer" flow passage lamination that covers one of the even layer flow passage laminations most remote from the conduction surface of the heat source.
Figure 7:
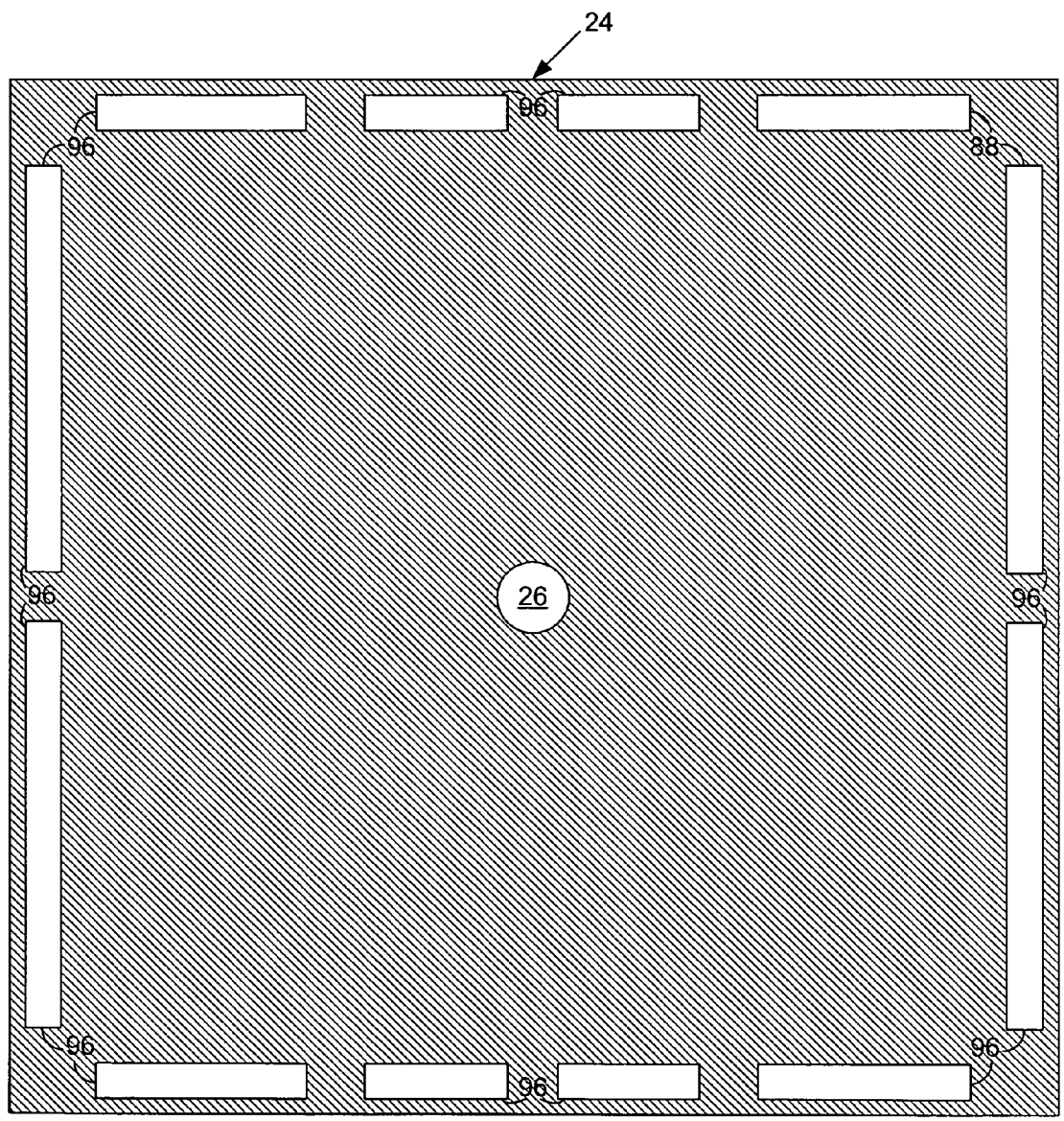
FIG. 7 is a top view of a "cover layer" flow passage lamination that covers the interface layer flow passage lamination.

The flow passage labyrinth 8 preferably comprises a laminated structure made up of several layers of flow passages. FIG. 3 is a top view of a target layer flow passage lamination 16 that covers a substantial portion of the conduction surface 6 of the heat source 4. FIG. 4 is a top view of an "even layer" flow passage lamination 18 that covers the target layer flow passage lamination 16. FIG. 5 is a top view of an "odd layer" flow passage lamination 20 that covers at least one even layer flow passage lamination 18. An additional even layer flow passage lamination 18 covers the odd layer flow passage lamination 20. Additional pairs of the odd layer flow passage lamination 20 and the even layer flow passage lamination 18 may cover the additional even layer flow passage lamination 18. FIG. 6 is a top view of an "interface layer" flow passage lamination 22 that covers one of the even layer flow passage laminations 18 most remote from the surface 6. FIG. 7 is a top view of a "cover layer" flow passage lamination 24 that covers the interface layer flow passage lamination 22. Fabrication of the laminations 16, 18, 20, 22 and 24 may conveniently comprise photo-etched copper laminations. Other fabrication materials and processes may also be suitable, such as micro electro mechanical systems (MEMS) and integrated circuit (IC) processes, depending upon scale.

FIG. 1 shows a typical laminated structure for the flow passage labyrinth 8 according to the invention. The target layer flow passage lamination 16 covers a substantial portion of the surface 6 of the heat source 4. A first one of the even layer flow passage laminations 18 covers the target layer flow passage lamination 16. A first one of the odd layer flow passages 20 covers the first even layer flow passage lamination 18. A second one of the even layer flow passage laminations 18 covers the first odd layer flow passage lamination 20. A second one of the odd layer flow passage laminations 18 covers the first odd layer flow passage lamination 20. A third one of the even layer flow passage laminations 18 covers the second odd layer flow passage lamination 20. The interface layer flow passage lamination 22 covers the third even layer flow passage lamination 18. Finally, the top layer flow passage lamination 24 covers the interface layer flow passage lamination 22. The flow passage labyrinth 8 may conveniently comprise a stack of diffusion-bonded laminations 16, 18, 20, 22 and 24. Alternatively, bonding of the laminations 16, 18, 20, 22 and 24 may be by other processes, such as soldering. Such bonding is desirable to insure heat transfer through the stack of laminations 16, 18, 20, 22 and 24.

Referring to FIGS. 1 through 7 together, a liquid coolant that is suitable for two-phase cooling enters the coolant supply port 12 in the housing 10, travels down through a coolant supply passage 26 in the cover layer flow passage lamination 24, a coolant supply passage 28 in the interface layer flow passage lamination 22, a coolant supply passage 30 in each even layer flow passage lamination 18, a coolant supply passage 32 in each odd layer flow passage lamination 20 and a coolant supply passage 34 in the target layer flow passage lamination 16. Once the coolant reaches the surface 6 of the heat source 4, it starts to absorb heat and vaporise. It also starts to propagate through a plurality of innermost cooling passages 36 in the target layer flow passage lamination 16 that couple to and propagate radially from the coolant supply passage 34.

Since the quality of the coolant starts to increase as the coolant vaporises, the volume of the coolant increases as it propagates through the innermost cooling passages 36. The cross-sectional area of each innermost cooling passage 36 increases as the coolant propagates through it from the coolant supply passage 34 to an outlet end 38, thereby tending to increase volume and maintain nearly isobaric conditions as the coolant continues to absorb heat and vaporise. This in turn tends to maintain the coolant at a relatively constant temperature as it propagates through each of the innermost cooling passages 36. Since the flow path length is very short, boundary layer development is restricted, resulting in a thin boundary layer that improves heat transfer.

Figure 8:
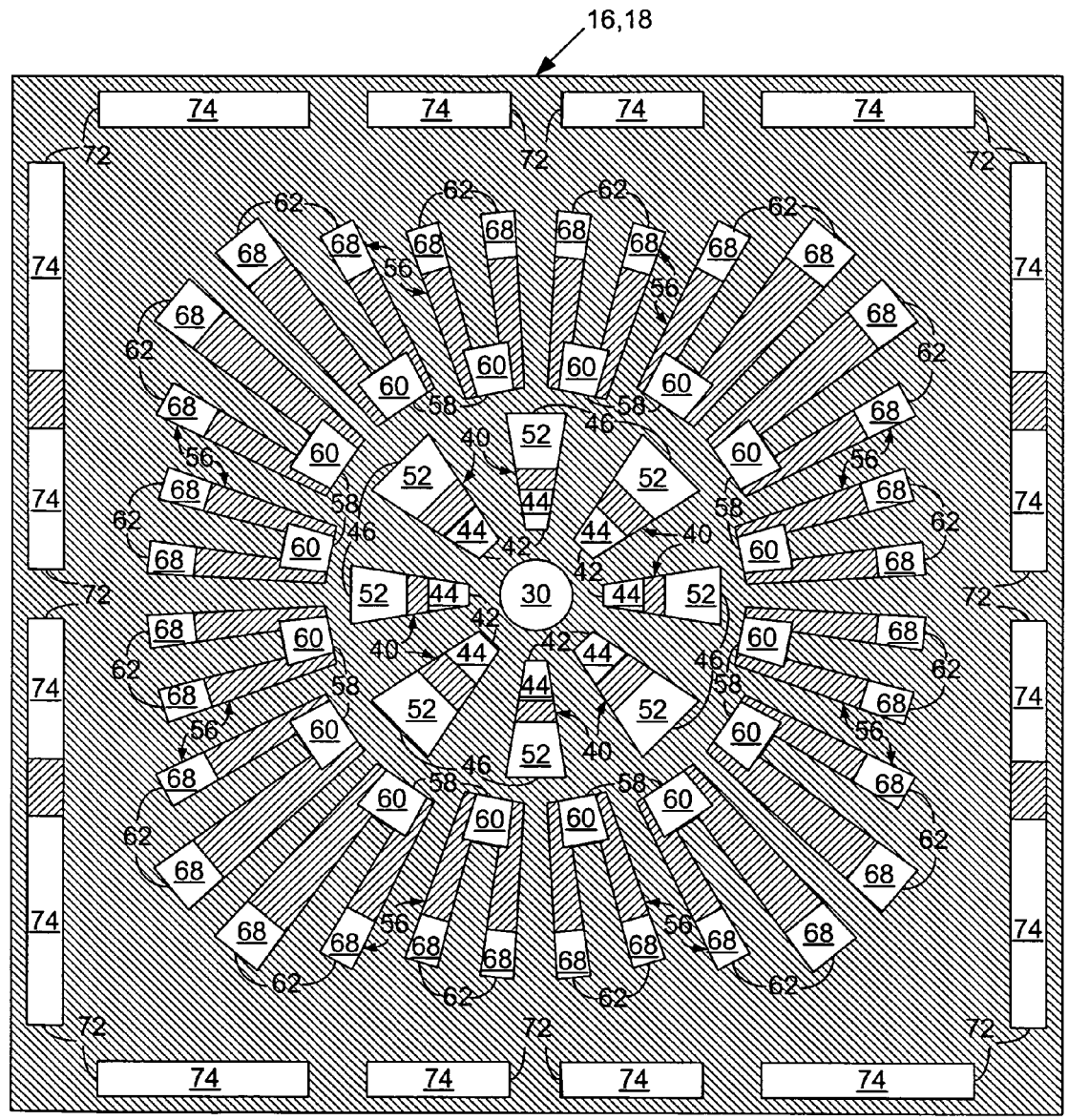
FIG. 8 is a top view of the first even layer flow passage lamination superimposed over the target layer flow passage lamination.

The coolant in each innermost cooling passage 36 then propagates from its outlet end 38 into the first even layer flow passage lamination 18 and starts a new propagation path through a corresponding one of a plurality of innermost cooling passages 40 proximate an inlet end 42. FIG. 8 is a top view of the first even layer flow passage lamination 18 superimposed over the target layer flow passage lamination 16, wherein an overlap between each innermost cooling passage 36 of the target layer flow passage lamination 16 proximate its outlet end 38 and a corresponding one of the innermost cooling passages 40 of the first even layer flow passage lamination proximate its inlet end 42 forms a corresponding one of a plurality of innermost coolant columns 44.

As the coolant propagates from the inlet end 42 to an outlet end 46 of each innermost cooling passage 40, the cross-sectional area of each innermost cooling passage 40 increases to an extent that tends to increase volume and maintain nearly isobaric conditions as the coolant continues to absorb heat and vaporise. This in turn tends to maintain the coolant at a relatively constant temperature as it propagates through each of the innermost cooling passages 40. Since the flow path length is very short, boundary layer development is restricted, resulting in a thin boundary layer that improves heat transfer.

Figure 9:
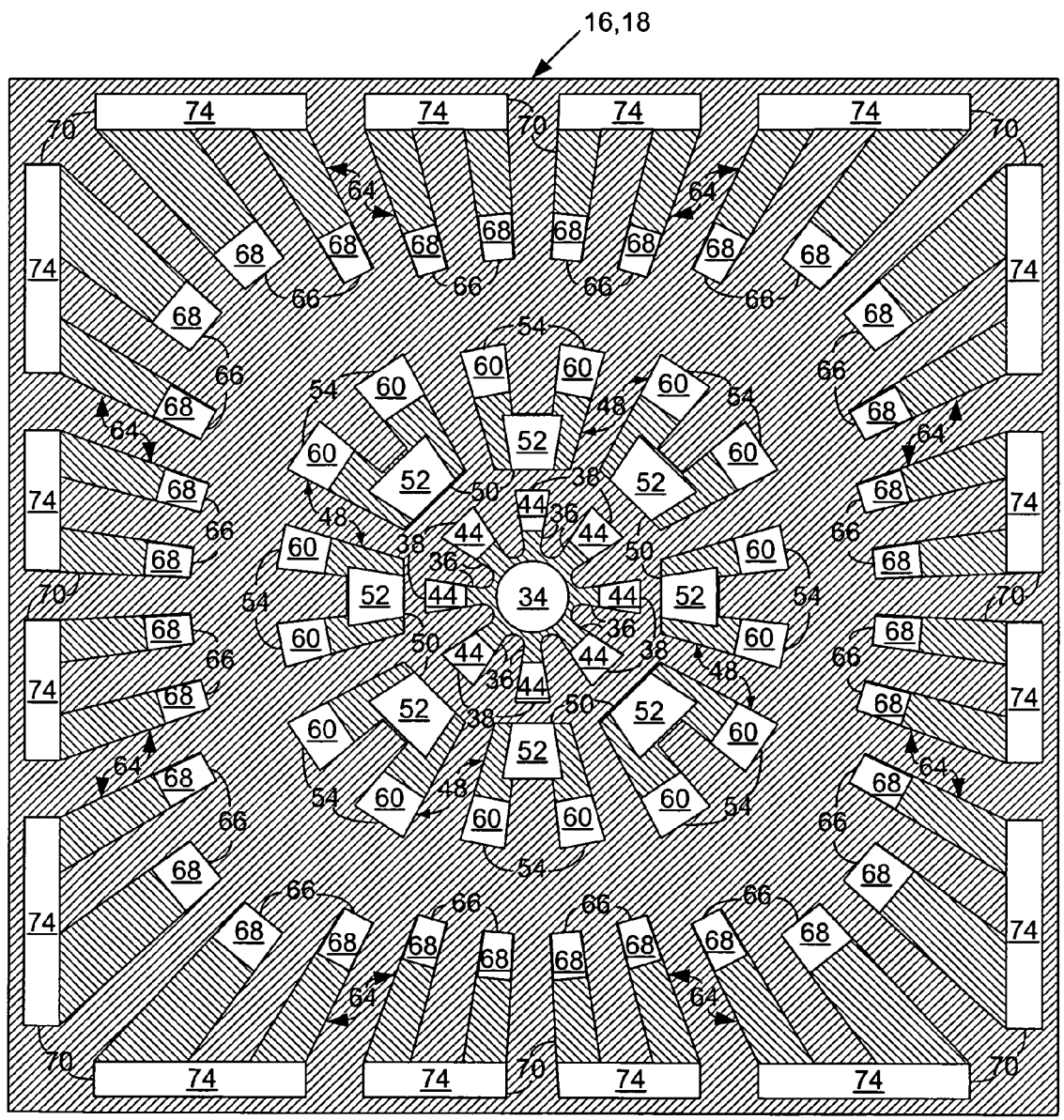
FIG. 9 is a bottom view of the target flow passage lamination superimposed under the first even layer flow passage lamination.

The coolant in each innermost cooling passage 40 then propagates from its outlet end 46 back into the target layer flow passage lamination 16 and starts a new propagation path along the surface 6 through a corresponding one of a plurality of intermediate cooling passages 48 proximate an inlet end 50. FIG. 9 is a bottom view of the target flow passage lamination 16 superimposed under the first even layer flow passage lamination 18, wherein an overlap between each innermost cooling passage 40 of the first even layer flow passage lamination 18 proximate its outlet end 46 and a corresponding one of the intermediate cooling passages 48 of the target layer flow passage lamination 16 proximate its inlet end 50 forms a corresponding one of a plurality of primary intermediate coolant columns 52.

As the coolant propagates from the inlet end 50 to at least one outlet end 54 of each intermediate cooling passage 48, the cross-sectional area of each intermediate cooling passage 48 increases to an extent that tends to increase volume and maintain nearly isobaric conditions as the coolant continues to absorb heat and vaporise. This in turn tends to maintain the coolant at a relatively constant temperature as it propagates through each of the intermediate cooling passages 48. Since the flow path length is very short, boundary layer development is restricted, resulting in a thin boundary layer that improves heat transfer.

The coolant in each intermediate cooling passage 48 then propagates from each outlet end 54 back into the first even layer flow passage lamination 18 and starts a new propagation path through a corresponding one of a plurality of outer cooling passages 56 proximate an inlet end 58. An overlap between each intermediate cooling passage 48 of the target layer flow passage lamination 16 proximate each outlet end 54 and each corresponding outer cooling passage 56 of the first even layer flow passage lamination 18 proximate its inlet end 58 forms a corresponding one of a plurality of secondary intermediate coolant columns 60.

As the coolant propagates from the inlet end 58 to at least one outlet end 62 of each outer cooling passage 56, the cross-sectional area of each outer cooling passage 56 increases to an extent that tends to increase volume and maintain nearly isobaric conditions as the coolant continues to absorb heat and vaporise. This in turn tends to maintain the coolant at a relatively constant temperature as it propagates through each of the outer cooling passages 56. Since the flow path length is very short, boundary layer development is restricted, resulting in a thin boundary layer that improves heat transfer.

The coolant in each outer cooling passage 56 then propagates from each outlet end 62 back into the target layer flow passage lamination 18 and starts a new propagation path along the surface 6 through a corresponding one of a plurality of outer cooling passages 64 proximate an inlet end 66. An overlap between each outer cooling passage 56 of the first even layer flow passage lamination 16 proximate each outlet end 58 and each outer cooling passage 64 of the target layer flow passage lamination 16 proximate its inlet end 66 forms a corresponding one of a plurality of tertiary intermediate coolant columns 68.

As the coolant propagates from the inlet end 66 to at least one outlet end 70 of each outer cooling passage 64, the cross sectional area of each intermediate cooling passage 64 increases to an extent that tends to increase volume and maintain nearly isobaric conditions as the coolant continues to absorb heat and vaporise. This in turn tends to maintain the coolant at a relatively constant temperature as it propagates through each of the outer cooling passages 64. Since the flow path length is very short, boundary layer development is restricted, resulting in a thin boundary layer that improves heat transfer. The coolant in each outer cooling passage 64 then propagates from each outlet end through a corresponding one of a plurality of coupling passages 72 in the first even layer flow passage lamination 18 to form a corresponding one of a plurality of outer coolant columns 74.

Figure 10:
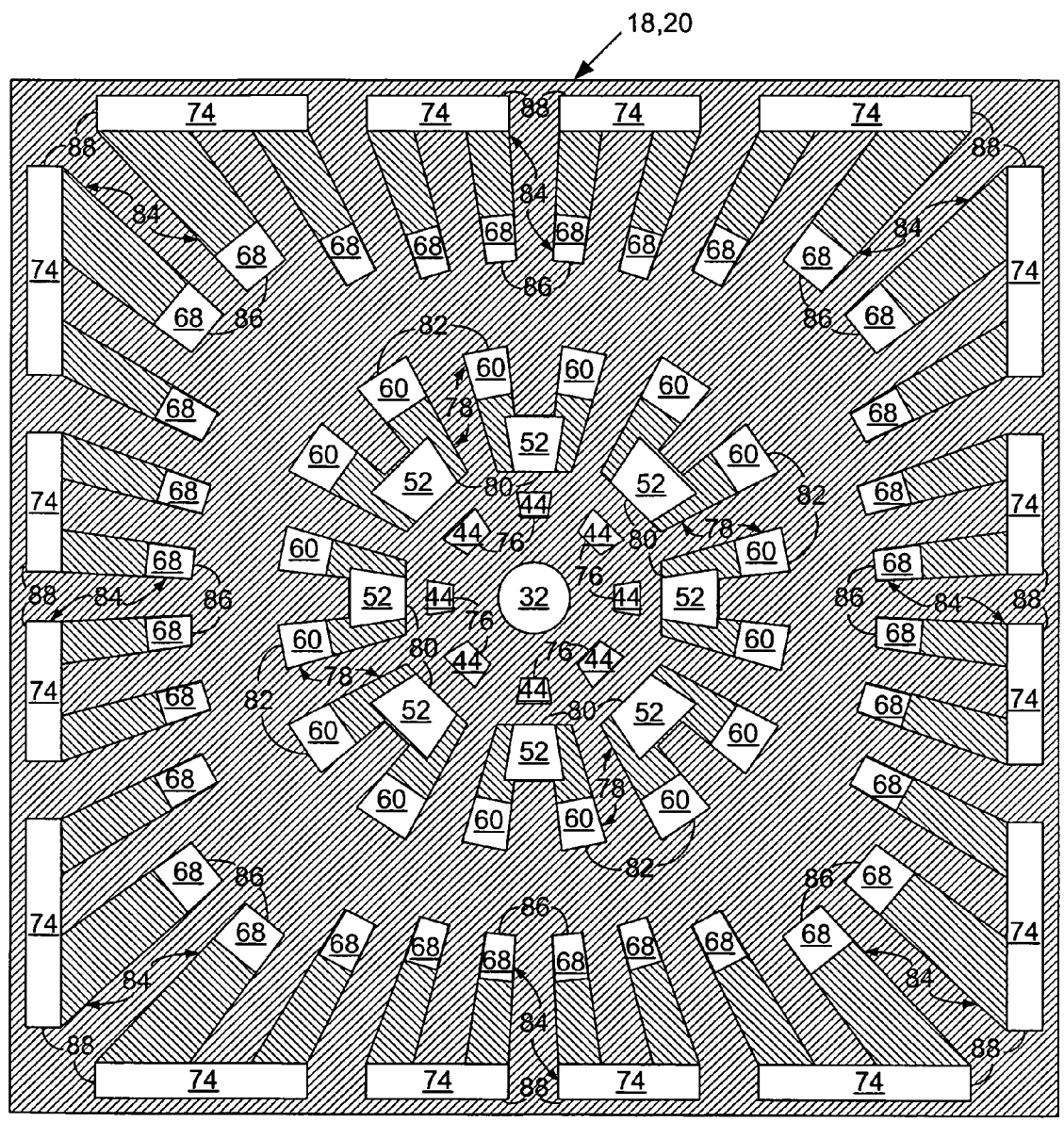
FIG. 10 is a top view of the first even layer flow passage lamination superimposed over the first even layer flow passage lamination.

FIG. 10 is a top view of the first odd layer flow passage lamination 20 superimposed over the first even layer flow passage lamination 18. Coolant from each innermost cooling column 44 passes through a corresponding one of a plurality of coupling passages 76 in the first one of the odd layer flow passage laminations 20. Coolant from each primary intermediate cooling column 52 propagates into a corresponding one of a plurality of inner cooling passages 78 in the first odd layer flow passage lamination 20 proximate an inlet end 80. As the coolant propagates from the inlet end 80 to at least one outlet end 82 of each inner cooling passage 78, the cross-sectional area of each inner cooling passage 78 increases to an extent that tends to increase volume and maintain nearly isobaric conditions as the coolant continues to absorb heat and vaporise. This in turn tends to maintain the coolant at a relatively constant temperature as it propagates through each of the inner cooling passages 78. Since the flow path length is very short, boundary layer development is restricted, resulting in a thin boundary layer that improves heat transfer. The coolant in each inner cooling passage 78 then propagates from each outlet end 82 into a corresponding one of the secondary intermediate coolant columns 60.

Coolant from each tertiary intermediate coolant column 68 propagates into a corresponding one of a plurality of outer cooling passages 84 proximate an inlet end 86. As the coolant propagates from the inlet end 86 to at least one outlet end 88 of each outer cooling passage 84, the cross-sectional area of each outer cooling passage 84 increases to an extent that tends to increase volume and maintain nearly isobaric conditions as the coolant continues to absorb heat and vaporise. This in turn tends to maintain the coolant at a relatively constant temperature as it propagates through each of the outer cooling passages 84. Since the flow path length is very short, boundary layer development is restricted, resulting in a thin boundary layer that improves heat transfer. The coolant in each outer cooling passage 84 then propagates from each outlet end 88 into a corresponding one of the outer coolant columns 74.

Coolant then flows through passages in the second and third even layer flow passage laminations 18 and the second odd layer flow passage lamination 20 as hereinbefore described, as well as for any additional pairs of the odd layer flow passage lamination 20 and the even layer flow passage lamination 18. Coolant from each tertiary intermediate cooling column 68 also propagates into a corresponding one of a plurality of cooling passages 90 in the interface layer cooling passage lamination 22 proximate at least one inlet end 92.

Figure 11:
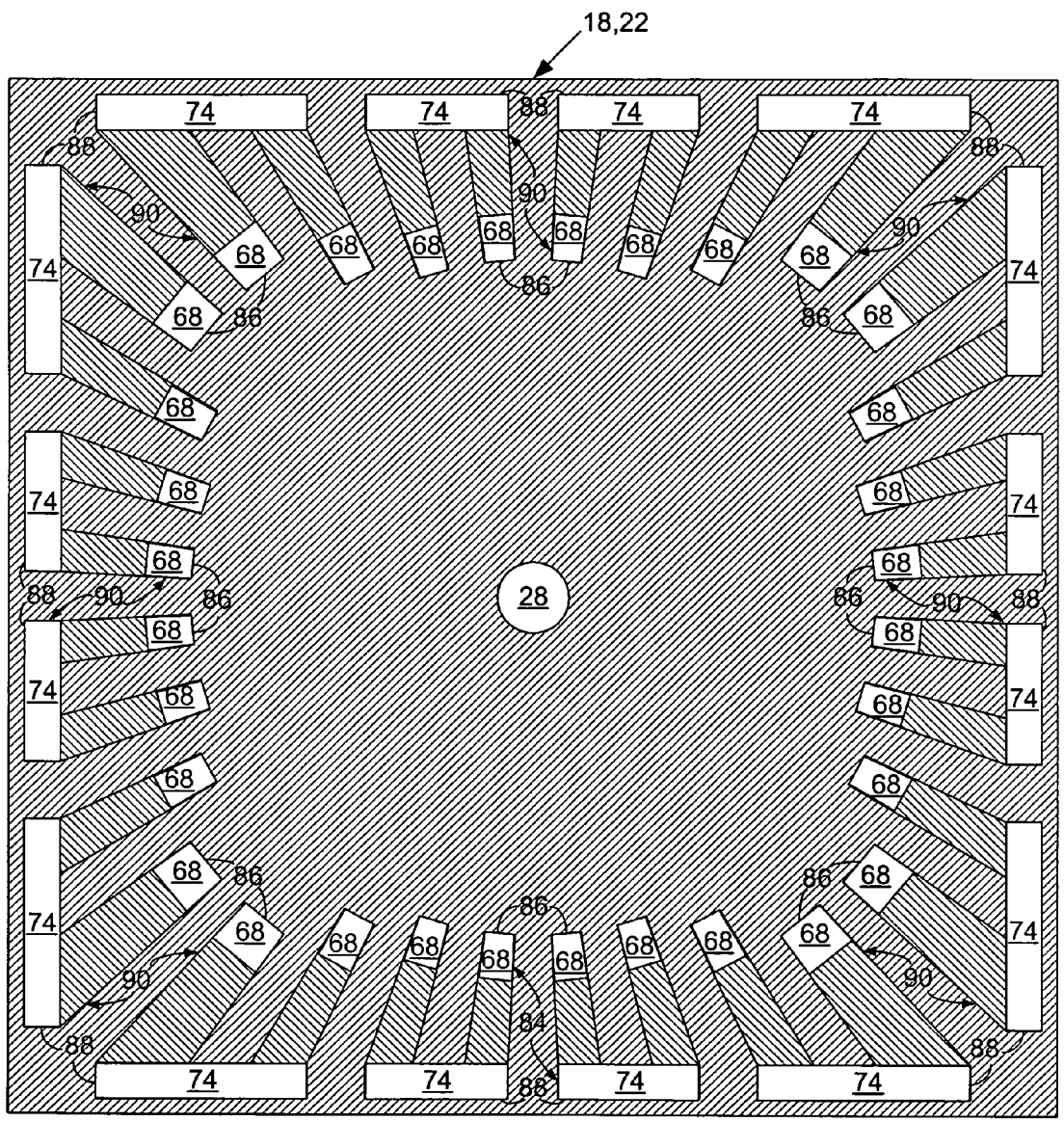
FIG. 11 is a top view of the interface layer 22 superimposed over the third one of the even layer flow passage laminations 18.

FIG. 11 is a top view of the interface layer 22 superimposed over the third one of the even layer flow passage laminations 18. As the coolant propagates from the inlet end 92 to at least one outlet end 94 of each cooling passage 90, the cross-sectional area of each outer cooling passage 90 increases to an extent that tends to increase volume and maintain nearly isobaric conditions as the coolant continues to absorb heat and vaporise. This in turn tends to maintain the coolant at a relatively constant temperature as it propagates through each of the cooling passages 90. Since the flow path length is very short, boundary layer development is restricted, resulting in a thin boundary layer that improves heat transfer. The coolant in each cooling passage 90 then propagates from each outlet end 94 into a corresponding one of the outer coolant columns 74. Finally, coolant in each outer cooling column 74 passes through a corresponding cover layer coupling passage 96 to discharge from the flow passage labyrinth 8.

In other words, referring to FIGS. 1 through 11 together, coolant propagates through the coolant supply port 12 through a central coolant supply column that comprises the cover layer flow passage 26, the interface layer coolant supply passage 28, each even layer coolant supply passage 30, each odd layer coolant supply passage 32 and the target layer coolant supply passage 34. From the target layer coolant supply passage 34, the coolant then propagates outward along the heat conduction surface 6 of the heat source 4. The coolant then propagates both radially and axially through the coolant flow passages and coolant columns that interweave or intercalate through at least four adjacent flow passage laminations that comprise the target layer flow passage lamination 16, one or more of the even layer flow passage laminations 18, one or more of the odd layer flow passage laminations 20 and the interface layer flow passage lamination 22 to offer the coolant expanding volume as the coolant evaporates due to absorbing heat within the coolant flow passages from the heat conduction surface 6 of the heat source 4. In this way, the coolant propagates three-dimensionally both radially outward from the heat conduction surface 6 of the heat source 4 proximate the central coolant supply column that comprises the cover layer flow passage 26, the interface layer coolant supply passage 28, each even layer coolant supply passage 30, each odd layer coolant supply passage 32 and the target layer coolant supply passage 34.

The flow passage labyrinth 8 achieves superior heat transfer by optimising the three factors of thermal conductance represented by the relationship $G=\eta hA$. The thermal conductance G is the rate of energy transfer per unit area and temperature difference between the coolant and heat source. The wetted surface area A is the total surface area of each of the sides, top and bottom of each of the linked flow passages within the flow passage labyrinth 8. The laminated construction of the flow passage labyrinth 8 affords low thermal resistances by combining high heat transfer coefficients, (h), abundant area enhancement (A), and good surface efficiency, $\eta$.

High heat transfer coefficients occur in flows that limit the development of the boundary layer. The boundary layer thickness determines the heat transfer coefficient in that it represents the "conduction thickness" in the fluid layer that insulates the cooler bulk flow from the hot wall. The flow passage labyrinth 8 minimises the boundary layer with flow passages that have direct liquid impingement, short flow path lengths for re-developing flow, and small channel size. Additionally, the laminations of the flow passage labyrinth 8 permit area enhancement ratios, that is, the wetted heat transfer surface area to the cooler footprint area, typically between approximately 10 and 30 to one. Like conventional laminated coolers, the ECHIC 2 for a large-scale heat source 4 may comprise a plurality of flow passage labyrinths 8 ganged together. Ganged flow passage labyrinths 8 may comprise individual units or multiple units fabricated within a single large laminated structure with integral headers. Similarly, the shape of the ECHIC 2 may adapt to the shape of the heat source 4. For instance, the ECHIC 2 for a heat source 4 that has a generally circular rather than square heat source conduction surface 6 may have a cylindrical instead of a rectangular shape to better conform to the heat source 4.

The ECHIC 2 extends the advantages of the bonded laminate technology to two-phase cooling. The bonded lamination of the flow passage labyrinth 8 allows a large wetted surface area for heat transfer to be close to the heat source 4. Because the surface areas of the coolant flow passages within ECHIC 2 are conductively close to the heat source 4 it is highly efficient in dissipating heat. Two-phase cooling systems greatly reduce coolant flow requirements through utilisation of the latent heat of coolants. The challenge in designing an evaporator for high outlet qualities is accommodating the large volumetric change that occurs during evaporation. The ECHIC 2 provides increasing flow area by using expanding areas in the radial and axial flow directions as the coolant propagates through the coolant flow passages and columns in the flow passage labyrinth 8. This flow arrangement limits flow velocities whilst still maintaining shear driven flow.

The ECHIC 2 achieves excellent heat transfer from the heat source 4 because the multiple laminate construction with numerous small linked flow passages provides wetted surface areas many times larger than the base footprint of the ECHIC 2 on the surface 6 of the heat source 4. This is because the total wetted surface area comprises the total surface area of the sides, top and bottom of each of the linked flow passages. Furthermore, the short flow paths of each flow passage within the flow passage labyrinth 8 restarts boundary layers at the inlet end of each flow passage, thereby limiting the conduction thickness of the boundary layers, resulting in high heat transfer coefficients. Finally, the compact structure of the thin laminations within the flow passage labyrinth 8 inherently has short conduction paths, yielding high heat transfer fin efficiencies.

The ECHIC 2 is useful in open and closed cooling cycles, as well as in a vapour compression cooling cycle. Due to the large heat of vaporisation, an open cooling cycle may use water as the liquid coolant. The open cooling cycle may simply vent wet steam discharged from the ECHIC 2 or it may separate the water from it and vent the dry steam. The closed cycle may also use water as the liquid coolant wherein it may condense the wet steam discharged from the ECHIC 2 in a condenser and recirculate the condensed water through the ECHIC 2. In addition to use in such conventional two-phase cooling cycles, the ECHIC 2 may also cool the heat source 4 under standby and low power conditions in a single-phase cooling cycle, such as with water as the liquid coolant. As the heat source 4 increases dissipated heat under normal operating conditions, the liquid coolant, such as water, may then vaporise, switching the ECHIC 2 to an efficient two-phase cooling cycle.

The described embodiment of the invention is only an illustrative implementation of the invention wherein changes and substitutions of the various parts and arrangement thereof are within the scope of the invention as set forth in the attached claims.

The claimed invention is:

1. An evaporative compact high intensity cooler (ECHIC) for transferring heat from a heat source along a heat conduction surface of the heat source with a two-phase coolant, comprising:
   a flow passage labyrinth of coolant flow passages and coolant columns intercalated within each of at least four adjacent flow passage laminations that radially and axially radiate from the heat conduction surface proximate a central coolant supply column, the coolant flow passages having cross-sectional areas that increase from an inlet end to an outlet end as they radiate from the central coolant supply column by way of radially increasing the width and by way of at least some of the coolant flow passages having the outlet end coupled to the inlet end of a downstream coolant flow passage that has multiple radially propagating branches, the outlet end of each branch coupling to the inlet end of a further downstream coolant flow passage that has multiple radially propagating branches, to offer the coolant expanding volume as the coolant evaporates due to absorbing heat within the coolant flow passages from the heat conduction surface.

2. The ECHIC of claim 1, wherein the coolant flow passages radiate generally parallel to the conduction surface of the heat source and the coolant columns radiate generally normal to the conduction surface of the heat source.

3. The ECHIC of claim 1, wherein the flow passage labyrinth comprises a stack of the flow passage laminations.

4. The ECHIC of claim 3, wherein the stack of flow passage laminations comprise a stack of diffusion-bonded flow passage laminations.

5. The ECHIC of claim 3, wherein each of the flow passage laminations comprise photo-etched copper laminations.

6. The ECHIC of claim 3, wherein the flow passage laminations transfer coolant through their respective coolant flow passages by way of the coolant columns.

7. The ECHIC of claim 3, wherein the coolant flows from the coolant flow passages within each flow passage lamination to the coolant flow passages in adjacent ones of the flow passage laminations by way of the coolant columns.

8. The ECHIC of claim 3, wherein the coolant columns overlap exit and entrance ends of the coolant flow passages in adjacent ones of the flow passage laminations.

9. An evaporative compact high intensity cooler (ECHIC) for transferring heat from a heat source along a heat conduction surface of the heat source with a two-phase coolant, comprising:
   a flow passage labyrinth of coolant flow passages generally parallel to the heat conduction surface of the heat source and coolant columns generally normal to the heat conduction surface of the heat source intercalated within each of at least four adjacent flow passage laminations that radially and axially radiate from the heat conduction surface proximate a central coolant supply column, the coolant flow passages having cross-sectional areas that increase from an inlet end to an outlet end as they radiate from the central coolant supply column by way of radially increasing the width and by way of at least some of the coolant flow passages having the outlet end coupled to the inlet end of a downstream coolant flow passage that has two radially propagating branches, the outlet end of each branch coupling to the inlet end of a further downstream coolant flow passage that has two radially propagating branches, to offer the coolant expanding volume as the coolant evaporates due to absorbing heat within the coolant flow passages from the heat conduction surface.

10. The ECHIC of claim 9, wherein the flow passage labyrinth comprises a stack of the flow passage laminations.

11. The ECHIC of claim 10, wherein the stack of flow passage laminations comprise a stack of diffusion-bonded flow passage laminations.

12. The ECHIC of claim 10, wherein each of the flow passage laminations comprise photo-etched copper laminations.

13. The ECHIC of claim 10, wherein the flow passage laminations transfer coolant through their respective coolant flow passages by way of the coolant columns.

14. The ECHIC of claim 10, wherein the coolant flows from the coolant flow passages within each flow passage lamination to the coolant flow passages in adjacent ones of the flow passage laminations by way of the coolant columns.

15. The ECHIC of claim 10, wherein the coolant columns overlap exit and entrance ends of the coolant flow passages in adjacent ones of the flow passage laminations.

16. An evaporative compact high intensity cooler (ECHIC) for transferring heat from a heat source along a heat conduction surface of the heat source with a two-phase coolant, comprising:

a flow passage labyrinth comprising a stack of at least four adjacent diffusion bonded copper flow passage laminations that have photo-etched coolant flow passages generally parallel to the heat conduction surface and coolant columns generally normal to the heat conduction surface, with the coolant flow passages and the coolant columns intercalated within the adjacent diffusion bonded copper flow passage laminations that radially and axially radiate from the heat conduction surface proximate a central coolant supply passage column along the adjacent diffusion bonded copper flow passage laminations and the coolant columns, the coolant flow passages having cross-sectional areas that increase with distance from the central coolant supply column from an inlet end to an outlet end by way of radially increasing the width and by way of at least some of the coolant flow passages having the outlet end coupled to the inlet end of a downstream coolant flow passage that has two radially propagating branches, the outlet end of each branch coupling to the inlet end of a further downstream coolant flow passage that has two radially propagating branches, to offer the coolant expanding volume as the coolant evaporates due to absorbing heat within the coolant flow passages from the heat conduction surface.

17. The ECHIC of claim 16, wherein the flow passage laminations transfer coolant through their respective coolant flow passages by way of the coolant columns.

18. The ECHIC of claim 16, wherein the coolant flows from the coolant flow passages within each flow passage lamination to the coolant flow passages in adjacent ones of the flow passage laminations by way of the coolant columns.

19. The ECHIC of claim 16, wherein the coolant columns overlap exit and entrance ends of the coolant flow passages in adjacent ones of the flow passage laminations.

20. The ECHIC of claim 1, wherein the coolant passages with multiple radially propagating branches have two radially propagating branches.

* * * * *